United States Patent
Chiou et al.

(10) Patent No.: US 9,224,599 B2
(45) Date of Patent: Dec. 29, 2015

(54) P-TYPE METAL OXIDE SEMICONDUCTOR MATERIAL AND METHOD FOR FABRICATING THE SAME

(71) Applicant: INDUSTRIAL TECHNOLOGY RESEARCH INSTITUTE, Hsinchu (TW)

(72) Inventors: Shan-Haw Chiou, Baoshan Shiang (TW); Tzu-Chi Chou, Taichung (TW); Chiung-Hui Huang, Qigu Township (TW); Yu-Tzu Hsieh, Hengshan Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/576,401

(22) Filed: Dec. 19, 2014

(65) Prior Publication Data

US 2015/0187573 A1    Jul. 2, 2015

Related U.S. Application Data

(60) Provisional application No. 61/922,321, filed on Dec. 31, 2013.

(51) Int. Cl.
  *H01L 21/02* (2006.01)
  *H01L 29/22* (2006.01)
  *H01L 29/36* (2006.01)

(52) U.S. Cl.
  CPC .... *H01L 21/02579* (2013.01); *H01L 21/02554* (2013.01); *H01L 21/02628* (2013.01); *H01L 21/02664* (2013.01); *H01L 29/22* (2013.01); *H01L 29/36* (2013.01)

(58) Field of Classification Search
  CPC .... H01L 29/12; H01L 29/242; H01L 29/7869
  USPC ................ 257/43, 750, 762, E33.069, 29.296
  See application file for complete search history.

(56) References Cited

U.S. PATENT DOCUMENTS

| | | | |
|---|---|---|---|
| 5,928,790 A | * | 7/1999 | Bokisa .......................... 428/416 |
| 7,039,078 B2 | | 5/2006 | Matsuoka et al. |

(Continued)

FOREIGN PATENT DOCUMENTS

| | | |
|---|---|---|
| TW | 200833852 A | 8/2008 |
| TW | 201229269 A1 | 7/2012 |
| TW | 201341315 A | 10/2013 |

OTHER PUBLICATIONS

Jung et al., "The effects of high-energy electron beam irradiation on the properties of IGZO thin films prepared by rf magnetron sputtering", Journal of Ceramic Processing Research, 2012, vol. 13, Special. 2, pp. s246-s250.

(Continued)

*Primary Examiner* — Michael Lebentritt
(74) *Attorney, Agent, or Firm* — Birch, Stewart, Kolasch & Birch, LLP

(57) ABSTRACT

A P-type metal oxide semiconductor material is provided. The P-type metal oxide semiconductor material has a formula of $In_{(1-a)}Ga_{(1-b)}Zn_{(1+a+b)}O_4$, wherein $0 \leq a \leq 0.1$, $0 \leq b \leq 0.1$, and $0 < a+b \leq 0.16$. In particular, the P-type metal oxide semiconductor material has a hole carrier concentration of between $1 \times 10^{11}$ cm$^{-3}$ and $5 \times 10^{18}$ cm$^{-3}$.

13 Claims, 6 Drawing Sheets

(56) References Cited

U.S. PATENT DOCUMENTS

| | | |
|---|---|---|
| 8,007,694 B2 | 8/2011 | Chiu et al. |
| 8,384,112 B2 | 2/2013 | Tsang |
| 8,927,986 B2 * | 1/2015 | Chou et al. ............ 257/43 |
| 2005/0230695 A1 | 10/2005 | Takayama |
| 2005/0269647 A1 | 12/2005 | Briere |
| 2005/0269768 A1 | 12/2005 | Singer |
| 2012/0175610 A1 | 7/2012 | Yamazaki |
| 2012/0235114 A1 | 9/2012 | Tsang |
| 2012/0241724 A1 | 9/2012 | Tsang |

OTHER PUBLICATIONS

Kobayashi et al., "Possibility for hole doping into amorphous InGaZnO4 films prepared by RF sputtering", Physical Status Solidi C. 8, 2011, No. 2, pp. 531-533.

Narushima et al., "A p-type Amorphous oxide semiconductor and room temperature fabrication of amorphous oxide p-n heterojunction diodes", Advanced Materials, Sep. 3, 2003, vol. 15, No. 17, pp. 1409-1413.

Nomura et al., "Room-temperature fabrication of transparent flexible thin-film transistors using amorphous oxide semiconductors", Nature, Nov. 25, 2004, vol. 432, pp. 488-492.

Nomura et al., "Thin-Film Transistor Fabricated in Single-Crystalline Transparent Oxide semiconductor", Science, 2003, 300, pp. 1269-1272.

Nomura, K. et al, "Amorphous Oxide Semiconductors for High-Performance Flexible Thin-Film Transistors," Jpn. J. Appl. Phys., May 2006, vol. 45, No. 5B, pp. 4303-4308.

Taiwan Office Action for Appl. No. 103144441 dated Sep. 24, 2015.

* cited by examiner

P-TYPE METAL OXIDE SEMICONDUCTOR MATERIAL AND METHOD FOR FABRICATING THE SAME

CROSS REFERENCE TO RELATED APPLICATION

This application claims the benefit of U.S. Provisional Application No. 61/922,321, filed on Dec. 31, 2013, which is incorporated herein by reference.

TECHNICAL FIELD

The disclosure relates to a P-type metal oxide semiconductor material and a method for fabricating the same.

BACKGROUND

Metal oxide semiconductor material is widely applied in many photoelectric and semiconductor devices (such as light-emitting devices, light-receiving devices, piezoelectric devices, transparent conductive electrodes, and active elements). For example, metal oxide semiconductor material can be used in the manufacturing of transparent thin film transistors. In comparison with the thin film transistors manufactured from amorphous silicon, the thin film transistors manufactured from transparent metal oxide-based semiconductor material can provide smaller thin film transistor sizes, superior refinement, and higher carrier mobility (for example, electron mobility).

Current transparent metal oxide-based semiconductor materials are basically n-type transparent zinc oxide-based semiconductor materials. Metal oxide-based p-type semiconductor materials are relatively rare, since the metal oxide-based p-type semiconductor materials have unstable characteristics and inferior reproducibility. Both the n-type and p-type semiconductor materials, however, are required to form PN junctions for manufacturing photoelectric and semiconductor devices such as transparent complementary metal oxide semiconductors (CMOS), transparent smart windows, inverters, and light-emitting diodes (LEDs).

Therefore, a novel p-type transparent zinc oxide-based semiconductor material is desired for solving the aforementioned problems.

SUMMARY

An embodiment of the disclosure provides a P-type metal oxide semiconductor material having a formula of:
$In_{(1-a)}Ga_{(1-b)}Zn_{(1+a+b)}O_4$, wherein $0 \leq a \leq 0.1$, $0 \leq b$ 0.1, and $0 < a+b \leq 0.16$. In particular, the P-type metal oxide semiconductor material of the disclosure has a hole carrier concentration of between $1 \times 10^{11}$ cm$^{-3}$ and $5 \times 10^{18}$ cm$^{-3}$.

Furthermore, according to embodiments of the disclosure, the disclosure provides a method for fabricating a P-type metal oxide semiconductor material. The method includes: adding an indium salt, a gallium salt, and a zinc salt into a solvent, obtaining a mixture; adding a chelating agent into the mixture, forming an indium-gallium-zinc containing metal complex; and subjecting the metal complex to a thermal treatment to form the P-type metal oxide semiconductor material.

Moreover, according to other embodiments of the disclosure, the disclosure also provides a method for fabricating the P-type metal oxide semiconductor material including: mixing an indium oxide, a gallium oxide, and a zinc oxide, obtaining a mixture; and, subjecting the mixture to a sintering process to form the P-type metal oxide semiconductor material.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

An embodiment of the disclosure provides a P-type metal oxide semiconductor material having a formula of: $In_{(1-a)}Ga_{(1-b)}Zn_{(1+a+b)}O_4$, wherein $0 \leq a \leq 0.1$, $0 \leq b \leq 0.1$, and $0 < a+b \leq 0.16$. Furthermore, according to some embodiments of the disclosure, the disclosure provides a P-type metal oxide semiconductor material having a formula of: $InGa_{(1-b)}Zn_{(1+b)}O_4$, wherein $0 < b \leq 0.1$. Moreover, according to other embodiments of the disclosure, the disclosure provides a P-type metal oxide semiconductor material having a formula of: $In_{(1-a)}GaZn_{(1+a)}O_4$, wherein $0 < a \leq 0.1$. In the embodiments of the disclosure, conditions for forming p-type IGZO-based (indium-gallium-zinc oxide based) metal oxide semiconductor materials are obtained by preliminary simulation and calculation procedures. Next, the p-type IGZO-based metal oxide semiconductor materials doped with a specific indium-gallium-zinc molar ratio are synthesized.

Figure 1:
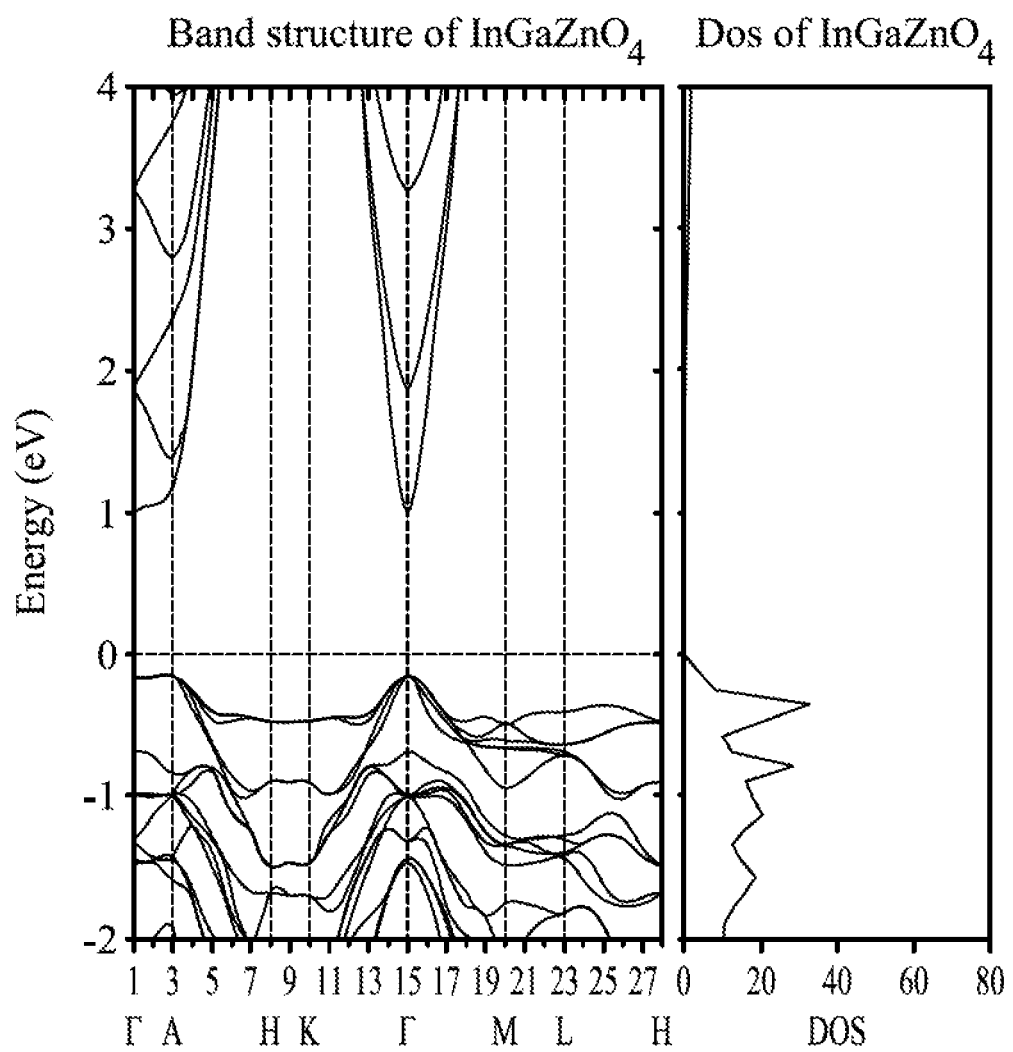
FIG. 1 is a graph showing a band structure of InGaZnO$_4$
Figure 2:
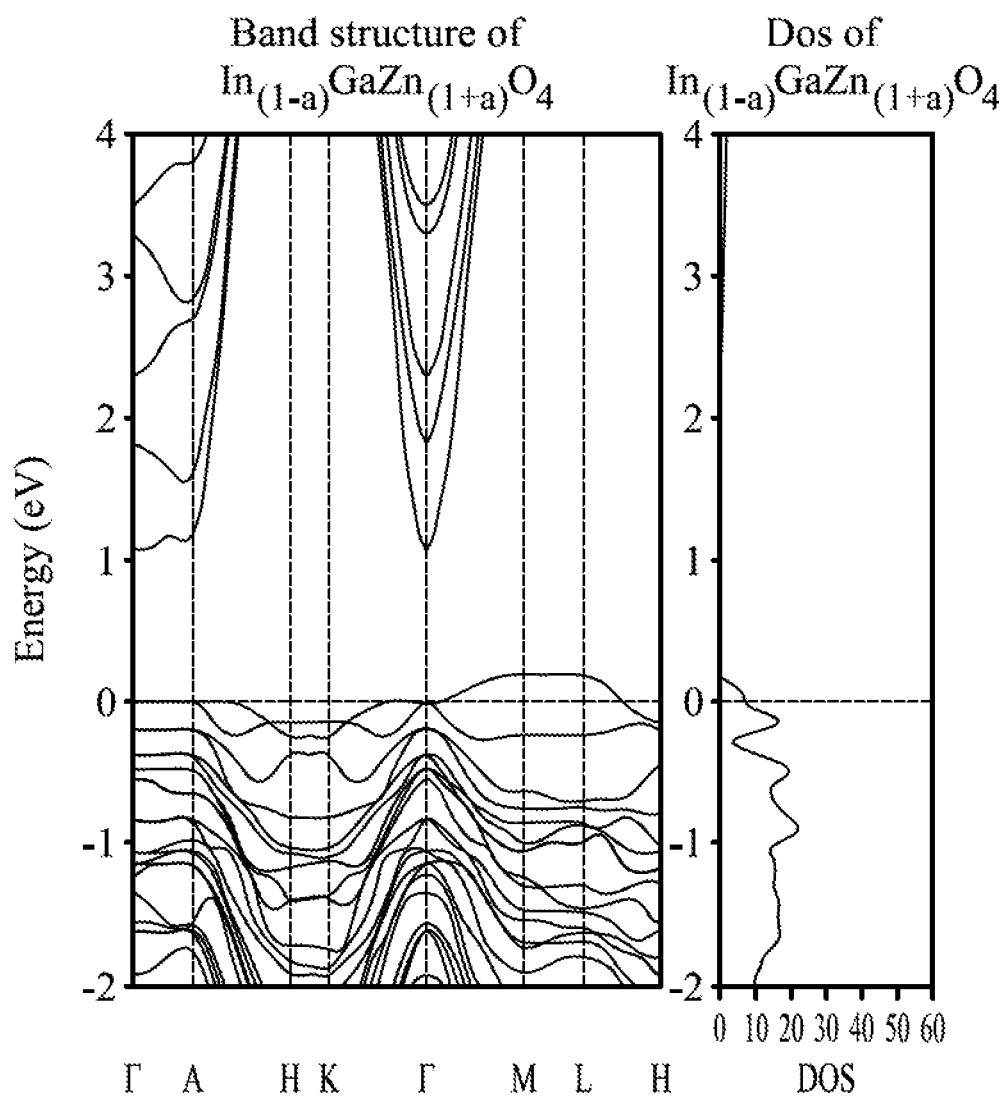
FIG. 2 is a graph showing a band structure of $In_{(1-a)}GaZn_{(1+a)}O_4$
Figure 3:
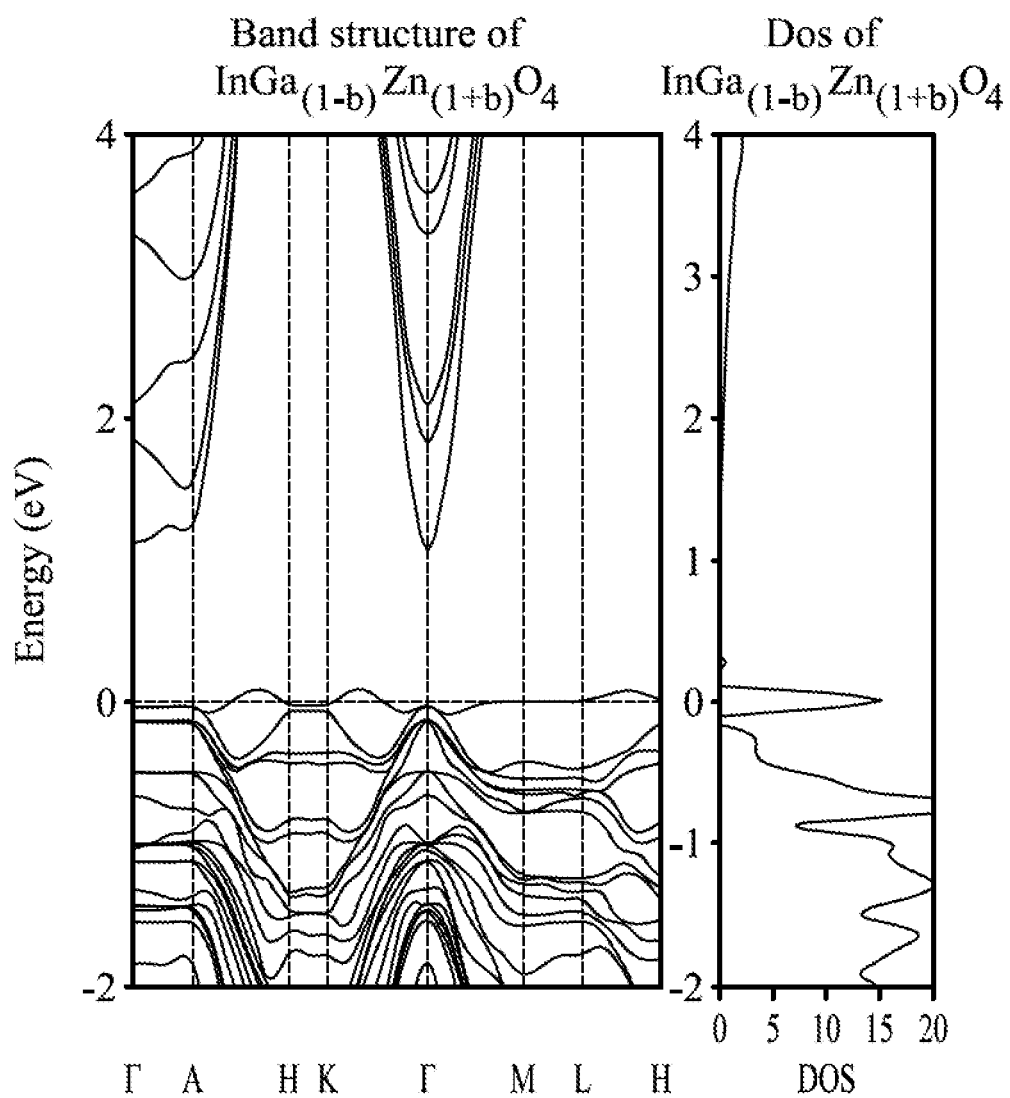
FIG. 3 is a graph showing a band structure of $InGa_{(1-b)}Zn_{(1+b)}O_4$

Such simulation and calculation procedures are described as follows. In the present disclosure, Vienna Ah-initio Simulation Package (VASP) is involved in the calculation of the variation of density of states (DOS) to energy in the IGZO-based metal oxide semiconductor materials with a specific indium-gallium-zinc molar ratio. According to the results of the simulations, the Fermi level of the IGZO-based metal oxide semiconductor materials, which have a formula of $In_{(1-a)}Ga_{(1-b)}Zn_{(1+a+b)}O_4$ (wherein $0 < a \leq 0.1$, $b = 0$, or $0 < b \leq 0.1$, $a = 0$), shifts to the valence band. Therefore, they are p-type metal oxide semiconductor materials. FIG. 1 is a graph showing a band structure of InGaZnO4 calculated by the ab initio method. FIG. 2 is a graph showing a band structure of $In_{(1-a)}GaZn_{(1+a)}O_4$ calculated by ab initio and the fermi level (E(eV)=0) shift to the valance band that indicates p-type materials. FIG. 3 is a graph showing a band structure of $InGa_{(1-b)}Zn_{(1+b)}O_4$ calculated by the ab initio method, the fermi level (E(eV)=0) shift to the valance band that indicates p-type materials.

Next, the IGZO-based metal oxide semiconductor materials with a specific indium-gallium-zinc molar ratio are respectively synthesized via a soft chemistry process or a sintering process based on the simulation and calculation results.

For example, in the soft chemistry process, an indium salt, a gallium salt, and a zinc salt can be added into a solvent (such as water, methanol, ethanol, propanol, glycol, or combination thereof), and then stirred at room temperature for 1 hr, obtaining an indium-gallium-zinc containing mixture. According to embodiments of the disclosure, the molar ratio of indium to zinc can be between 0.9:1.1 and 1:1.001 in the mixture. Furthermore, the molar ratio of gallium to zinc can be between 0.9:1.1 and 1:1.001 in the mixture. The indium salt can be indium sulfate, indium chloride, indium nitrate, indium hydroxide, indium citrate, indium acetate, indium acetylacetonate or a combination thereof; the gallium salt can be gallium sulfate, gallium chloride, gallium nitrate, gallium hydroxide, gallium citrate, gallium acetate, gallium acetylacetonate or a combination thereof; and the zinc salt can be zinc sulfate, zinc chloride, zinc nitrate, zinc hydroxide, zinc citrate, zinc acetate, zinc acetylacetonate, or a combination thereof. Furthermore, during the preparation of the mixture, an acid or base can be added to adjust the pH value of the mixture, in order to enhance the solubility.

Next, a chelating agent can be added into the mixture, obtaining a solution, wherein the solution includes an indium-gallium-zinc metal complex. The chelating agent can be tartaric acid, citric acid, malic acid, glycolic acid, gluconic acid, heptogluconic acid, ethylenediaminetetraacetic acid, diethylenetriaminepentaacetic acid, or a combination thereof.

Next, the solution can be heated to 150-200° C., in order to remove a part of the solvent to form a sol-gel solution. After subjected the solution to a drying process (such as a baking process or a sintering process), P-type metal oxide semiconductor powder is obtained via the oxidation of the metal complex. Next, a ceramic process (such as compression molding, injection molding, cold isostatic press (CIP) or slip casting) can be performed to manufacture bulks or targets of the IGZO-based metal oxide semiconductor powder with a specific indium-gallium-zinc molar ratio.

After manufacturing the bulks or targets, a thin doped IGZO-based metal oxide semiconductor film may be formed by a sputtering process or the like and then be involved in the manufacturing of electronic devices (for example, transparent displays, transparent field-effect transistors, light-emitting diodes, or transparent integrated circuit semiconductor devices).

Furthermore, according to embodiments of the disclosure, the P-type metal oxide semiconductor material of the disclosure can be fabricated by subjecting metal oxide to a sintering process. First, an indium oxide, a gallium oxide, and a zinc oxide can be mixed in a specific ratio, obtaining a mixture. According to embodiments of the disclosure, the molar ratio of indium to zinc is between 0.9:1.1 and 1:1.001, or the molar ratio of gallium to zinc is between 0.9:1.1 and 1:1.001.

Next, a ceramic process (such as compression molding, injection molding, cold isostatic press (CIP), or slip casting) can be performed to manufacture bulks or targets of the IGZO-based metal oxide semiconductor powder with a specific indium-gallium-zinc molar ratio.

After manufacturing the bulks or targets, a thin doped IGZO-based metal oxide semiconductor film may be formed by a sputtering process or the like and then be involved in the manufacturing of electronic devices (for example, transparent displays, transparent field-effect transistors, light-emitting diodes, or transparent integrated circuit semiconductor devices).

The following examples are intended to illustrate the disclosure more fully without limiting the scope, since numerous modifications and variations will be apparent to those skilled in this art.

Zn Substituted for In IGZO-Based Material

EXAMPLE 1

First, 0.1658 mol of $In(NO_3)_3$, 0.1675 mol of $Zn(NO_3)_2$, and 0.1667 mol of $Ga(NO_3)_3$ were added into 300 ml of nitrate aqueous solution (10-50 wt %), obtaining a mixture. In particular, the molar ratio of In, Ga, and Zn was 0.995:1:1.005. Next, 0.55 mol of tartaric aid (serving as a chelating agent) was added into the mixture, and then stirred at room temperature for 1 hr, obtaining a solution including an indium-gallium-zinc containing metal complex.

Next, the above solution was heated to 155° C. in order to remove some of the water of the solution to form a sol-gel solution. Next, the sol-gel solution was subjected to a drying process (with a temperature of 1200-1400° C.), obtaining a Zn substituted for In IGZO-based powder via oxidation.

Finally, the Zn substituted for In IGZO-based powder was subjected to a molding process to manufacture a target of the IGZO-based metal oxide semiconductor material. The IGZO-based metal oxide semiconductor material obtained from Example 1 has a formula of $In_{0.995}GaZn_{1.005}O_4$.

Figure 4:
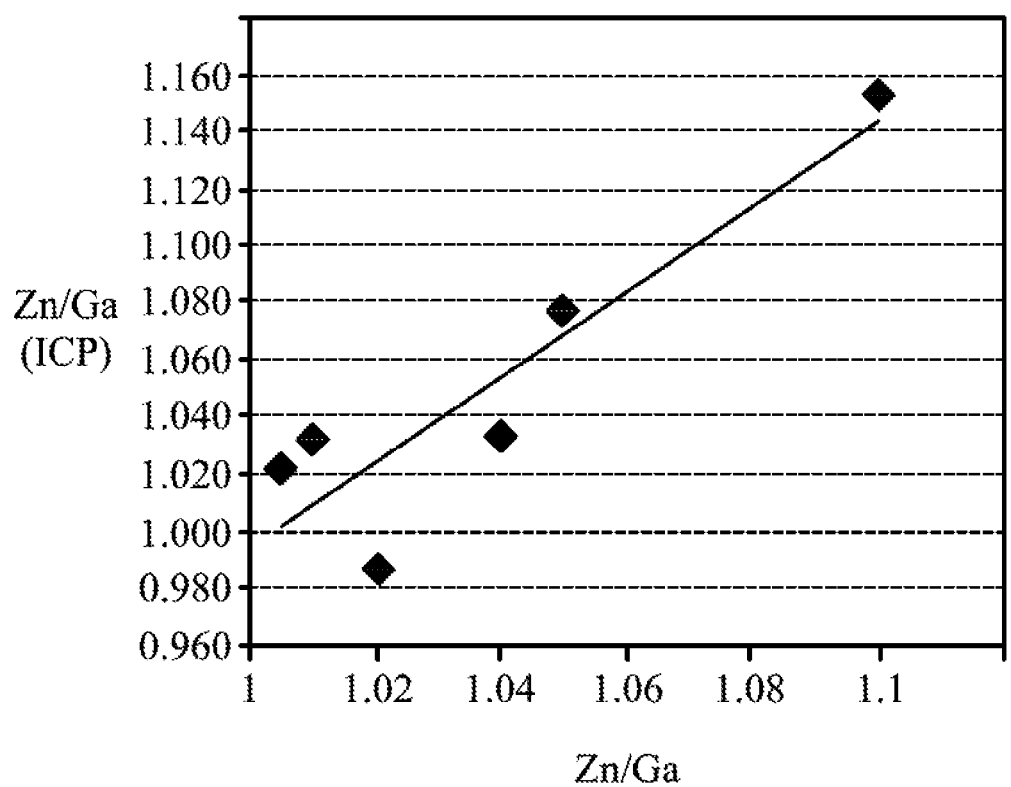
FIG. 4 shows a graph plotting the Zn/Ga molar ratio measured by ICP-MS of the P-type metal oxide semiconductor material against the Zn/Ga molar ratio of the mixture of Examples 1-6.

The content of the IGZO-based metal oxide semiconductor material were confirmed by ICP-MS, and the results are shown in FIG. 4. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 1.

EXAMPLE 2

First, 0.1650 mol of $In(NO_3)_3$, 0.1683 mol of $Zn(NO_3)_2$, and 0.1667 mol of $Ga(NO_3)_3$ were added into 300 ml of nitrate aqueous solution (10-50 wt %), obtaining a mixture. The molar ratio of In, Ga, and Zn was 0.99:1:1.01. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for In IGZO-based powder via oxidation.

Finally, the Zn substituted for In IGZO-based powder was subjected to a molding process to manufacture a target of the IGZO-based metal oxide semiconductor material. The IGZO-based metal oxide semiconductor material obtained from Example 2 has a formula of $In_{0.99}GaZn_{1.01}O_4$.

The content of the IGZO-based metal oxide semiconductor material were confirmed by ICP-MS, and the results are shown in FIG. 4. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 1.

EXAMPLE 3

First, 0.1663 mol of $In(NO_3)_3$, 0.1700 mol of $Zn(NO_3)_2$, and 0.1667 mol of $Ga(NO_3)_3$ were added into 300 ml of nitrate aqueous solution (10-50 wt %), obtaining a mixture. In particular, the molar ratio of In, Ga, and Zn was 0.98:1:1.02. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 153° C. in order to removing a part of water of the solution to form a sol-gel solution. Next, the sol-gel solution was subjected to a drying process (with a temperature of 1200-1400° C.), obtaining a Zn substituted for In IGZO-based powder via oxidation.

Finally, the Zn substituted for In IGZO-based powder was subjected to a molding process to manufacture a target of the IGZO-based metal oxide semiconductor material. The IGZO-based metal oxide semiconductor material obtained from Example 3 has a formula of $In_{0.98}GaZn_{1.02}O_4$.

The content of the IGZO-based metal oxide semiconductor material were confirmed by ICP-MS, and the results are shown in FIG. 4. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 1.

EXAMPLE 4

First, 0.1600 mol of $In(NO_3)_3$, 0.1733 mol of $Zn(NO_3)_2$, and 0.1667 mol of Ga(NO3)3 were added into 300 ml of nitrate aqueous solution (10-50 wt %), obtaining a mixture. In particular, the molar ratio of In, Ga, and Zn was 0.96:1:1.04. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for In IGZO-based powder via oxidation.

Finally, the Zn substituted for In IGZO-based powder was subjected to a molding process to manufacture a target of the IGZO-based metal oxide semiconductor material. The IGZO-based metal oxide semiconductor material obtained from Example 4 has a formula of $In_{1.04}GaZn_{1.04}O_4$.

The content of the IGZO-based metal oxide semiconductor material were confirmed by ICP-MS, and the results are shown in FIG. 4. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 1.

EXAMPLE 5

First, 0.158 mol of $In(NO_3)_3$, 0.17.50 mol of $Zn(NO_3)_2$, and 0.1667 mol of $Ga(NO_3)_3$ were added into 300 ml of nitrate aqueous solution (10-50 wt %), obtaining a mixture. In particular, the molar ratio of In, Ga, and Zn was 0.95:1:1.05. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for In IGZO-based powder via oxidation.

Finally, the Zn substituted for In IGZO-based powder was subjected to a molding process to manufacture a target of the IGZO-based metal oxide semiconductor material. The IGZO-based metal oxide semiconductor material obtained from Example 5 has a formula of $In_{0.95}GaZn_{1.05}O_4$.

The content of the IGZO-based metal oxide semiconductor material were confirmed by ICP-MS, and the results are shown in FIG. 4. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 1.

EXAMPLE 6

First, 0.1500 mol of $In(NO_3)_3$, 0.1833 mol of $Zn(NO_3)_2$, and 0.1667 mol of $Ga(NO_3)_3$ were added into 300 ml of nitrate aqueous solution (10-50 wt %), obtaining a mixture. In particular, the molar ratio of In, Ga, and Zn was 0.9:1:1.1. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for In IGZO-based powder via oxidation.

Finally, the Zn substituted for In IGZO-based powder was subjected to a molding process to manufacture a target of the IGZO-based metal oxide semiconductor material. The IGZO-based metal oxide semiconductor material obtained from Example 6 has a formula of $In_{0.9}GaZn_{1.1}O_4$.

The content of the IGZO-based metal oxide semiconductor material were confirmed by ICP-MS, and the results are shown in FIG. 4. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 1.

TABLE 1

| | content | percentage of Zn substituted for In (%) | bulk resistivity (ohm-cm) | mobility ($cm^2$/V-s) | carrier concentration ($cm^{-3}$) | type |
|---|---|---|---|---|---|---|
| Example 1 | $In_{0.995}GaZn_{1.005}O_4$ | 0.5% | 4.56E−04 | 21.26 | 6.44E+20 | p |
| Example 2 | $In_{0.99}GaZn_{1.01}O_4$ | 1% | 1.92E−04 | 10.9 | 2.99E+21 | p |
| Example 3 | $In_{0.98}GaZn_{1.02}O_4$ | 2% | 1.67E−03 | 66.7 | 5.614E+19 | p |

TABLE 1-continued

| content | | percentage of Zn substituted for In (%) | bulk resistivity (ohm-cm) | mobility (cm$^2$/V-s) | carrier concentration (cm$^{-3}$) | type |
|---|---|---|---|---|---|---|
| Example 4 | In$_{0.96}$GaZn$_{1.04}$O$_4$ | 4% | 1.41E+05 | 95.3 | 4.64E+11 | p |
| Example 5 | In$_{0.95}$GaZn$_{1.05}$O$_4$ | 5% | 0.1112 | 178 | 3.149E+17 | p |
| Example 6 | In$_{0.9}$GaZn$_{1.1}$O$_4$ | 10% | 66.48 | 57.74 | 1.626E+15 | p |

As shown in Table 1, the majority carrier type measured by Hall effect measurement is hole and the hole carrier concentration is in a range of $1\times10^{11}$-$5\times10^{21}$ cm$^{-3}$, which falls within the carrier concentration range of a semiconductor when Zn atoms substitute for In atoms in the IGZO-based metal oxide semiconductor materials (i.e., In$_{(1-a)}$GaZn$_{(1+a)}$O$_4$, wherein 0<a≤0.1), and the molar ratio of In to Zn is between 0.999:1.001 and 0.9:1.1. Therefore, the IGZO-based metal oxide semiconductor materials in Examples 1-6 are p-type. Furthermore, since the Zn substituted for In IGZO-based metal oxide semiconductor materials in Examples 1-6 have a high mobility and a low resistance, preferable p-type semiconductor materials are obtained within the specific In/Zn mole ratio range.

Zn Substituted for Ga IGZO-Based Material

EXAMPLE 7

First, 0.1667 mol of In(NO$_3$)$_3$, 0.1675 mol of Zn(NO$_3$)$_2$, and 0.1658 mol of Ga(NO$_3$)$_3$ were added into 300 ml of nitrate aqueous solution (10-50 wt %), obtaining a mixture. In particular, the molar ratio of In, Ga, and Zn was 1:0.995:1.005. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for Ga IGZO-based powder via oxidation.

Finally, the Zn substituted for Ga IGZO-based powder was subjected to a molding process to manufacture a target of the IGZO-based metal oxide semiconductor material. The IGZO-based metal oxide semiconductor material obtained from Example 7 has a formula of InGa$_{0.995}$Zn$_{1.005}$O$_4$.

Figure 5:
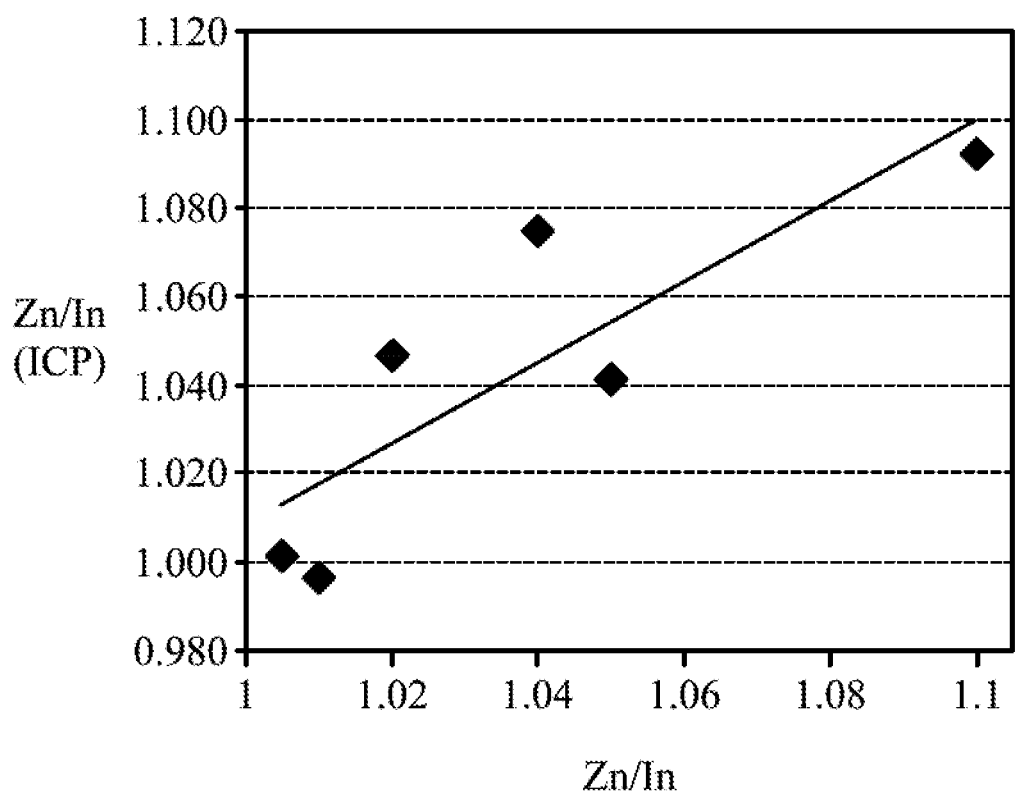
FIG. 5 shows a graph plotting the Zn/In molar ratio measured by ICP-MS of the P-type metal oxide semiconductor material against the Zn/In molar ratio of mixture of Examples 7-12.

The content of the IGZO-based metal oxide semiconductor material were confirmed by ICP-MS, and the results are shown in FIG. 5. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 2.

EXAMPLE 8

First, 0.1667 mol of In(NO$_3$)$_3$, 0.1683 mol of Zn(NO$_3$)$_2$, and 0.1650 mol of Ga(NO$_3$)$_3$ were added into 300 ml of nitrate aqueous solution (10-50 wt %), obtaining a mixture. In particular, the molar ratio of In, Ga, and Zn was 1:0.99:1.01. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for Ga IGZO-based powder via oxidation.

Finally, the Zn substituted for Ga IGZO-based powder was subjected to a molding process to manufacture a target of the IGZO-based metal oxide semiconductor material. The IGZO-based metal oxide semiconductor material obtained from Example 8 has a formula of InGa$_{0.99}$Zn$_{1.01}$O$_4$.

The content of the IGZO-based metal oxide semiconductor material were confirmed by ICP-MS, and the results are shown in FIG. 5. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 2.

EXAMPLE 9

First, 0.1667 mol of In(NO$_3$)$_3$, 0.1700 mol of Zn(NO$_3$)$_2$, and 0.1667 mol of Ga(NO$_3$)$_3$ were added into 300 ml of nitrate aqueous solution (10-50 wt %), obtaining a mixture. In particular, the molar ratio of In, Ga, and Zn was 1:0.98:1.02. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for Ga IGZO-based powder via oxidation.

Finally, the Zn substituted for Ga IGZO-based powder was subjected to a molding process to manufacture a target of the IGZO-based metal oxide semiconductor material. The IGZO-based metal oxide semiconductor material obtained from Example 9 has a formula of InGa$_{0.98}$Zn$_{1.02}$O$_4$.

The content of the IGZO-based metal oxide semiconductor material were confirmed by ICP-MS, and the results are shown in FIG. 5. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 2.

EXAMPLE 10

First, 0.1667 mol of In(NO$_3$)$_3$, 0.1733 mol of Zn(NO$_3$)$_2$, and 0.1600 mol of Ga(NO$_3$)$_3$ were added into 300 ml of nitrate a aqueous solution (10-50 wt %), obtaining a mixture. In particular, the molar ratio of In, Ga, and Zn was 1:0.96:1.04. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for Ga IGZO-based powder via oxidation.

Finally, the Zn substituted for Ga IGZO-based powder was subjected to a molding process to manufacture a target of the IGZO-based metal oxide semiconductor material. The IGZO-based metal oxide semiconductor material obtained from Example 10 has a formula of $InGa_{0.96}Zn_{1.04}O_4$.

The content of the IGZO-based metal oxide semiconductor material were confirmed by ICP-MS, and the results are shown in FIG. 5. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 2.

EXAMPLE 11

First, 0.1667 mol of $In(NO_3)_3$, 0.750 mol $Zn(NO_3)_2$, and 0.1583 mol of $Ga(NO_3)_3$ were added into 300 ml of nitrate aqueous solution (10-50 wt %), obtaining a mixture. In particular, the molar ratio of In, Ga, and Zn was 1:0.95:1.05. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for Ga IGZO-based powder via oxidation.

Finally, the Zn substituted for Ga IGZO-based powder was subjected to a molding process to manufacture a target of the IGZO-based metal oxide semiconductor material. The IGZO-based metal oxide semiconductor material obtained from Example 11 has a formula of $InGa_{0.95}Zn_{1.05}O_4$.

The content of the IGZO-based metal oxide semiconductor material were confirmed by ICP-MS, and the results are shown in FIG. 5. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 2.

EXAMPLE 12

First, 0.1667 mol of $In(NO_3)_3$, 0.1833 mol of $Zn(NO_3)_2$, and 0.1500 mol of $Ga(NO_3)_3$ were added into 300 ml of nitrate aqueous solution (10-50 wt %), obtaining a mixture. In particular, the molar ratio of In, Ga, and Zn was 1:0.9:1.1. Next, 0.55 mol of tartaric acid (serving as a chelating agent) was added into the mixture, and then stirred at room temperature for 1 hr, obtaining a solution including an indium-gallium-zinc containing metal complex.

Next, the above solution was heated to 155° C. in order to removing a part of water of the solution to form a sol-gel solution. Next, the sol-gel solution was subjected to a drying process (with a temperature of 1200-1400° C.), obtaining a Zn substituted for Ga IGZO-based powder via oxidation.

Finally, the Zn substituted for Ga IGZO-based powder was subjected to a molding process to manufacture a target of the IGZO-based metal oxide semiconductor material. The IGZO-based metal oxide semiconductor material obtained from Example 12 has a formula of $InGa_{0.9}Zn_{1.1}O_4$.

The content of the IGZO-based metal oxide semiconductor material were confirmed by ICP-MS, and the results are shown in FIG. 5. Next, the bulk resistivity, mobility, and carrier concentration of the IGZO-based metal oxide semiconductor material were measured by HL 5550 LN2 Cryostat Hall Effect Measurement Setup (manufactured by Nano Metrics) via the Hall effect measurement. The results are shown in Table 2.

TABLE 2

| | content | percentage of Zn substituted for Ga (%) | bulk resistivity (ohm-cm) | mobility ($cm^2$/V-s) | carrier concentration ($cm^{-3}$) | type |
|---|---|---|---|---|---|---|
| Example 7 | $InGa_{0.995}Zn_{1.005}O_4$ | 0.5% | 5.91E−06 | 22.5 | 4.70E+22 | p |
| Example 8 | $InGa_{0.99}Zn_{1.01}O_4$ | 1% | 5.77E−06 | 34.3 | 3.15E+22 | p |
| Example 9 | $InGa_{0.98}Zn_{1.02}O_4$ | 2% | 8.01E−03 | 5.96 | 1.308E+20 | p |
| Example 10 | $InGa_{0.96}Zn_{1.04}O_4$ | 4% | 5.96E+03 | 20.5 | 5.087E+13 | p |
| Example 11 | $InGa_{0.95}Zn_{1.05}O_4$ | 5% | 0.1767 | 83.53 | 4.229E+17 | p |
| Example 12 | $InGa_{0.9}Zn_{1.1}O_4$ | 10% | 30.99 | 1.975 | 1.02E+17 | p |

As shown in Table 2, the majority carrier type measured by Hall effect measurement is hole and the hole carrier concentration is in a range of $5\times10^{13}$-$5\times10^{22}$ $cm^{-3}$, which falls within the carrier concentration range of a semiconductor when Zn atoms substitute for Ga atoms in the IGZO-based metal oxide semiconductor materials (i.e., $InGa_{(1-b)}Zn_{(1+b)}O_4$, wherein 0<b≤0.1), and the molar ratio of Ga to Zn is between 0.999:1.001 and 0.9:1.1. Therefore, the IGZO-based metal oxide semiconductor materials in Examples 7-12 are p-type. Furthermore, since the Zn substituted for In IGZO-based metal oxide semiconductor materials in Examples 7-12 have a high mobility and a low resistance, preferable p-type semiconductor materials are obtained within the specific Ga/Zn mole ratio range.

Figure 6:
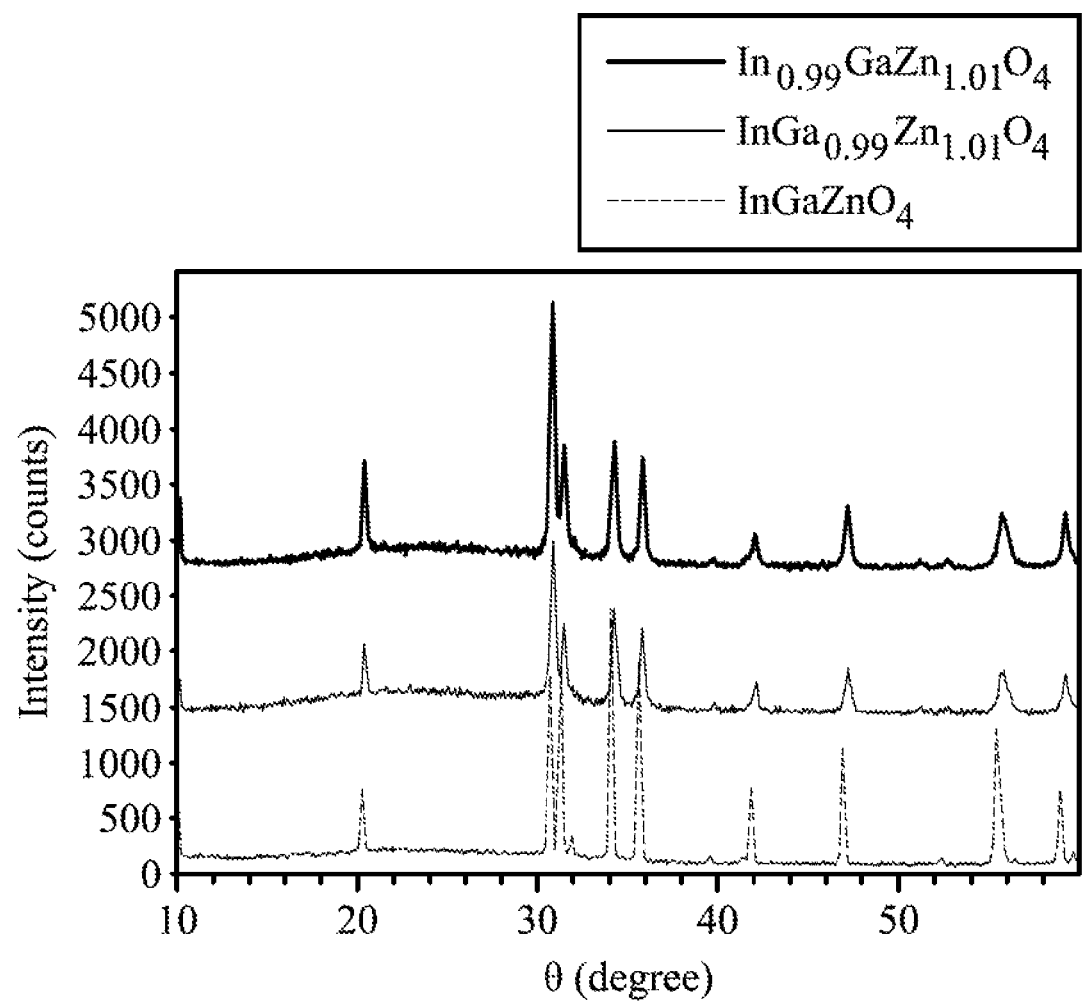
FIG. 6 shows x-ray diffraction spectra of InGaZnO$_4$, and the IGZO-based metal oxide semiconductor materials obtained from Examples 2 and 8.

FIG. 6 shows x-ray diffraction spectra of $InGaZnO_4$, and the IGZO-based metal oxide semiconductor materials obtained from Examples 2 and 8. As shown in FIG. 6, the IGZO-based metal oxide semiconductor materials obtained from Examples 2 and 8 have the same oxygen amount as that of the $InGaZnO_4$ by determining the intensity of oxygen, indium, and gallium. Namely, the formula of the IGZO-based metal oxide semiconductor materials obtained from Examples 2 and 8 has an oxygen number of 4.

According to the simulation and experimental results described, the method for fabricating a P-type metal oxide semiconductor material of the disclosure can obtain a p-type semiconductor material with a specific indium-gallium-zinc molar ratio, which has a high mobility and a low resistance, and can be applied for photoelectric and semiconductor devices.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A P-type metal oxide semiconductor material having a formula of:

$$In_{(1-a)}Ga_{(1-b)}Zn_{(1+a+b)}O_4$$

wherein $0 \leq a \leq 0.1$, $0 \leq b \leq 0.1$, and $0 < a+b \leq 0.16$, and wherein the P-type metal oxide semiconductor material has a hole carrier concentration of between $1 \times 10^{11}$ cm$^{-3}$ and $5 \times 10^{18}$ cm$^{-3}$.

2. The P-type metal oxide semiconductor material as claimed in claim 1, wherein $0 < a \leq 0.1$, and $b=0$.

3. The P-type metal oxide semiconductor material as claimed in claim 1, wherein $0 < b \leq 0.1$, and $a=0$.

4. A method for fabricating a P-type metal oxide semiconductor material, comprising:
    adding an indium salt, a gallium salt, and a zinc salt into a solvent, obtaining a mixture;
    adding a chelating agent into the mixture, forming an indium-gallium-zinc—containing metal complex; and
    subjecting the metal complex to a thermal treatment to form P-type metal oxide semiconductor material, wherein the P-type metal oxide semiconductor material has a formula of:

$$In_{(1-a)}Ga_{(1-b)}Zn_{(1+a+b)}O_4 \text{ wherein, } 0 \leq a \leq 0.1, 0 \leq b \leq 0.1, \text{ and } 0 < a+b \leq 0.16.$$

5. The method for fabricating a P-type metal oxide semiconductor material as claimed in claim 4, wherein the molar ratio of indium to zinc is between 0.9:1.1 and 1:1.001 in the mixture.

6. The method for fabricating at P-type metal oxide semiconductor material as claimed in claim 4, wherein, the molar ratio of gallium to zinc is between 0.9:1.1 and 1:1.001 in the mixture.

7. The method for fabricating a P-type metal oxide semiconductor material as claimed in claim 4, wherein the indium salt comprises indium sulfate, indium chloride, indium nitrate, indium hydroxide, indium citrate, indium acetate, indium acetylacetonate, or a combination thereof.

8. The method for fabricating a P-type metal oxide semiconductor material as claimed in claim 4, wherein the a gallium salt comprises gallium sulfate, gallium chloride, gallium nitrate, gallium hydroxide, gallium citrate, gallium acetate, gallium acetylacetonate, or a combination thereof.

9. The method for fabricating a P-type metal oxide semiconductor material as claimed in claim 4, wherein the zinc salt comprises zinc sulfate, zinc chloride, zinc nitrate, zinc hydroxide, zinc citrate, zinc acetate, zinc acetylacetonate, or a combination thereof.

10. The method for fabricating a P-type metal oxide semiconductor material as claimed in claim 4, wherein the chelating agent comprises tartaric acid, citric acid, malic acid, glycolic acid, gluconic acid, heptogluconic acid, ethylenediaminetetraacetic acid, diethylenetriaminetetraacetic acid, or a combination thereof.

11. The method for fabricating a P-type metal oxide semiconductor material as claimed in claim 4, wherein the thermal treatment is a sintering process.

12. The method for fabricating a P-type metal oxide semiconductor material claimed in claim 4, further comprising:
    performing a ceramic process to manufacture bulks or targets of the P-type metal oxide semiconductor material.

13. The method for fabricating a P-type metal oxide semiconductor material as claimed in claim 12, wherein the ceramic process comprises a compression molding, injection molding, cold isostatic press, or slip casting.

* * * * *